United States Patent [19]

Nakatsuka et al.

[11] Patent Number: 6,091,439
[45] Date of Patent: Jul. 18, 2000

[54] LASER PRINTER AND LIGHT SOURCE SUITABLE FOR THE SAME

[75] Inventors: Shinichi Nakatsuka, Hino; Susumu Saito, Hachioji; Akira Arimoto, Kodaira, all of Japan

[73] Assignees: Hitachi, Ltd.; Hitachi Koki Co., Ltd., both of Tokyo, Japan

[21] Appl. No.: 08/966,193

[22] Filed: Nov. 7, 1997

[30] Foreign Application Priority Data

Nov. 8, 1996 [JP] Japan ................................. 8-296150

[51] Int. Cl.[7] ......................................................... H01S 3/08
[52] U.S. Cl. ........................... 347/254; 372/97; 372/72; 333/227; 333/238; 333/246
[58] Field of Search ............................. 347/237, 247, 347/254; 333/127, 238, 239, 246, 247, 248, 249, 219, 227; 372/46, 72, 95, 97, 102, 92, 98

[56] References Cited

U.S. PATENT DOCUMENTS 5,007,066  4/1991  Eda ........................................... 372/108
5,809,053  9/1998  Nakatsuka et al. ........................ 372/46

*Primary Examiner*—N. Le
*Assistant Examiner*—Hai C. Pham
*Attorney, Agent, or Firm*—Antonelli, Terry, Stout & Kraus, LLP

[57] ABSTRACT

A laser printer is provided printing with a high precision simply and at a high speed, and the laser printer uses a semiconductor laser which can vary the diameter of the emitted light while the light density is held constant. In the laser printer, laser rays emitted from a semiconductor laser are irradiated onto a photoconductor to vary its surface potential to produce a charge pattern particles adhere, and printing is performed by transferring the changed particles to a printing object. The semiconductor laser has a plurality of waveguide type resonators, the emitted beams of the resonators having a spatial superposition, and light emission is possible so that the emitted beams of the resonators having a spatial superposition with respect to each other among the resonators of the semiconductor laser are not substantially superimposed in time.

8 Claims, 13 Drawing Sheets

LASER PRINTER AND LIGHT SOURCE SUITABLE FOR THE SAME

BACKGROUND OF THE INVENTION

The present invention relates to a laser printer for performing printing at high speed and with a high picture quality and to a light source suitable for use in the laser printer.

It has been reported that variation of the shape of printing dots is effective for printing in a laser printer at high speed and with a high precision. That is, the number of scanning lines must be increased to achieve high precision. This means that a longer scanning time is inevitably required. Therefore, it has been proposed that, if the shape of the printing dots is varied, the time required for the scanning can be reduced. Such technology is disclosed, for example, in A. Arimoto et. al., MOC' 95 HIROSIMA previous report 300P–303P (Akira Arimoto et. al., Hitachi Research Laboratory, Hitachi, Ltd. "A Resolution Enhancement Printing with Variable Spot Size Laser"). This system employs the following technology. In a part of a stripe region comprising a light emission region of a semiconductor laser device operating as a light source, a modulation region is provided where current injection is performed to divide the region into two parallel stripes. When the current injection in the two stripes is modulated, a lens capable of being electrically controlled is formed. The spot diameter of light emission of this semiconductor laser device can be varied by this lens effect. The shape of the printing dots is varied using such a semiconductor laser device.

SUMMARY OF THE INVENTION

In the printing system as above described, if the current injection amount is varied so as to vary the spot diameter, the light output also is varied. Thus, there is a problem that the complicated control is required in order to vary the spot diameter only, while the light density at the center of the spot is held constant.

An object of the present invention is to provide a laser printer where printing with a high precision can be performed simply at high speed.

Another object of the present invention is to provide a semiconductor laser where the diameter of the emitted light can be varied, while the light density is held constant.

In order to solve the above-mentioned problems, the present invention is constituted as follows.

In a laser printer, laser light emitted from a semiconductor laser is irradiated onto a photoconductor, its surface potential is varied to produce a charge image on which colored toner particles adhere, and the changed toner particle image is transferred to a printing medium. The semiconductor laser has a plurality of waveguide type resonators and is characterized in that the emitted beams of the resonators have a spatial superposition. The light emission is effected so that the emitted beams of the resonators, having a spatial superposition with respect to each other among the resonators of the semiconductor laser, do not substantially superpose each other in time.

The flickering speed of the light emission in the resonators, having a spatial superposition with respect o each other, but not substantially superposing each other in time among the resonators of the semiconductor laser, must be a speed at which flickering does not occur in the printing pattern. Thus, while the light density at the center of the spot necessary for the printing is held constant, the spot diameter of the light emission can be effectively varied.

As the structure of such a semiconductor laser, it is practicable to provide a structure wherein at least a part of a stripe-shaped resonator is bent, the distance between stripes in the vicinity of a light emitting unit is made small, and the distance between stripes in the remaining parts is made large. As a result, the distance between the beam emitting positions can be made less than the average distance between the resonators. The distance between the beam emitting positions is determined according to the spot diameter of the laser light to be sought. The distance between stripes at parts other than the beam emitting position is taken to be larger than that at the beam emitting position so that the light emissions of the stripes do not interfere with each other. This is because, if the light emissions of the stripes spatially superpose each other and interfere with each other, it is difficult to control the spot diameter of the semiconductor laser itself to a prescribed amount. Various examples of stripes having a bent portion are exemplified in the various embodiments to be later described.

In such a semiconductor laser, the resonators exist in an odd number. A group of every other stripe, including the center stripe, and a group of every other stripe not including the center stripe flicker complementarily, so that a larger variation of the spot diameter can be obtained. In addition, stripes of three in number are most useful from the aspects of the manufacturing and the drive control of the semiconductor laser.

Also, in accordance with the present invention, in order to increase the modulation speed of such a semiconductor laser, it is preferable in practice that regions other than the resonators of the semiconductor laser are covered by an insulator and a junction layer with a forbidden bandgap shrinking slantwise towards the electrode side is provided between a semiconductor crystal and the metal electrode of the resonator part, and that the current only in a part of the stripes is modulated.

According to the present invention, an effective printing at a high precision becomes possible without increasing the scanning times of the laser printer, and, moreover, since the stability of the light intensity is good, printing at a high speed and with a high picture quality can be easily realized. Although the above-mentioned laser printer represents an example of printing in a single color, the present invention, of course, may be applied also to a laser printer which is capable of multi-color printing.

In addition, although the semiconductor laser disclosed in accordance with the present invention is most suitable for a laser printer, it can be used, of course, in other applications.

DETAILED DESCRIPTION OF THE PREFERRED EMBODIMENTS

The present invention will become apparent from the following detailed description of preferred embodiments with reference to the accompanying drawings.

Before undertaking a specific description of the embodiments, the configuration of a laser printer will be briefly described. The basic configuration may be conventional except for the light source, which directly relates to the present invention. Of course, attendant on the configuration of the light source relating to the present invention, a part of the configuration of the conventional laser printer naturally may be varied.

Figure 1:
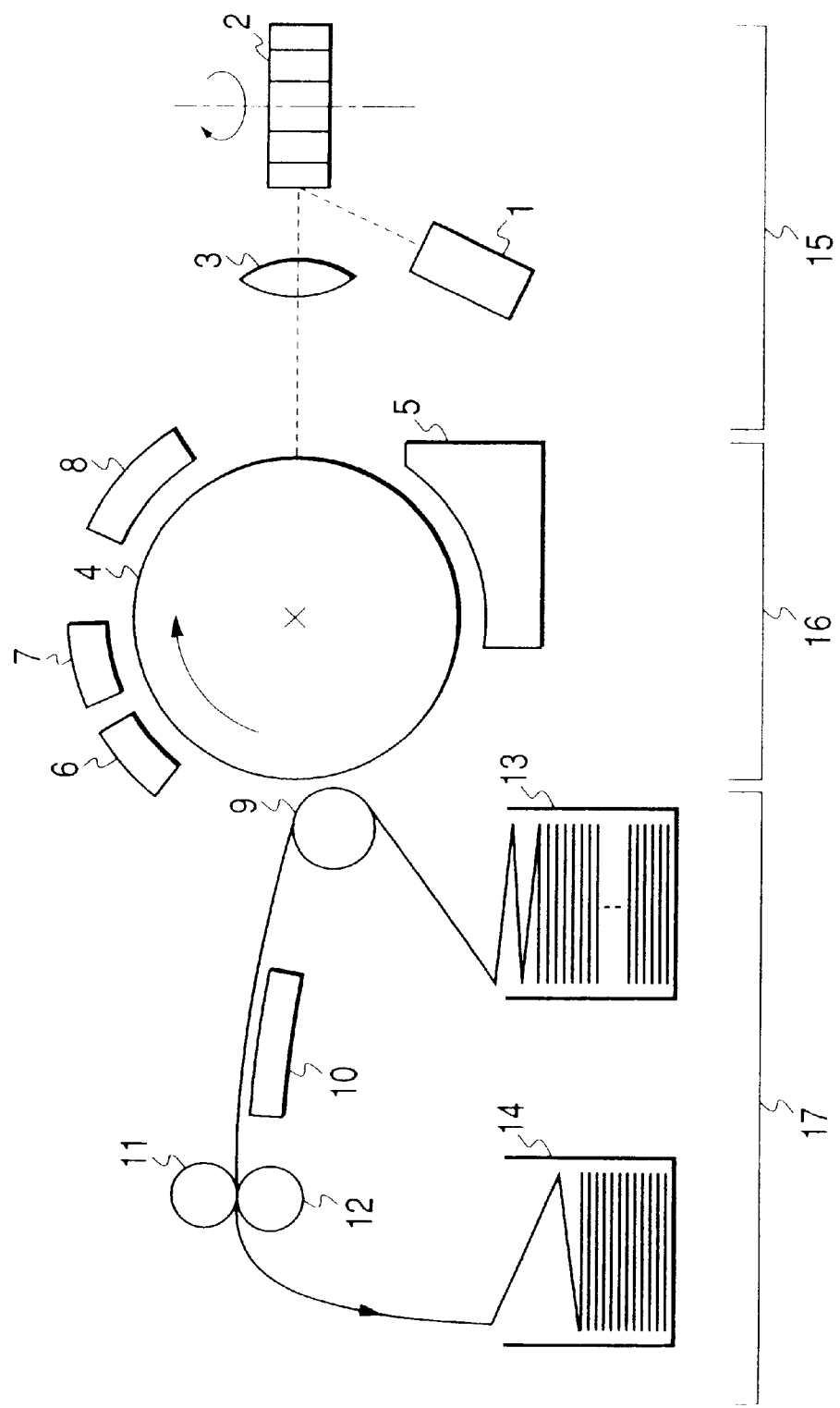
FIG. 1 is a schematic diagram of a typical laser printer.

FIG. 1 is a schematic diagram showing the configuration of a laser printer. The device comprises an exposure unit, an electrophotographic process unit and a paper transport unit. Further, in general, a computer system and a signal control unit are provided.

The operation of the laser printer itself is not basically different from that of a conventional one. In FIG. 1, numeral 15 designates a laser scan optical unit of the laser printer, numeral 16 designates an electrophotographic process unit and numeral 17 designates a paper transport unit. The laser scan optical system 15 comprises a semiconductor laser 1, a polygonal mirror 2 and an Fθ lens 3. The electrophotographic process unit 16 comprises a photoconductive drum 4 scanned by light from the laser scan optical unit, an eraser 6, a cleaner 7, a charger 8 for charging the photoconductive drum 4 and a developer 5. A transfer charger 9 for transferring an image formed on the photoconductive drum 4 to a printing paper is provided, and the electrophotographic process unit is connected to the paper transport unit. The paper transport unit 17 comprises a paper hopper 13, a preheater 10, a fixing unit 11, a heat roller 12 and a paper stacker 14 for receiving the printed paper in the final process.

Figure 2:
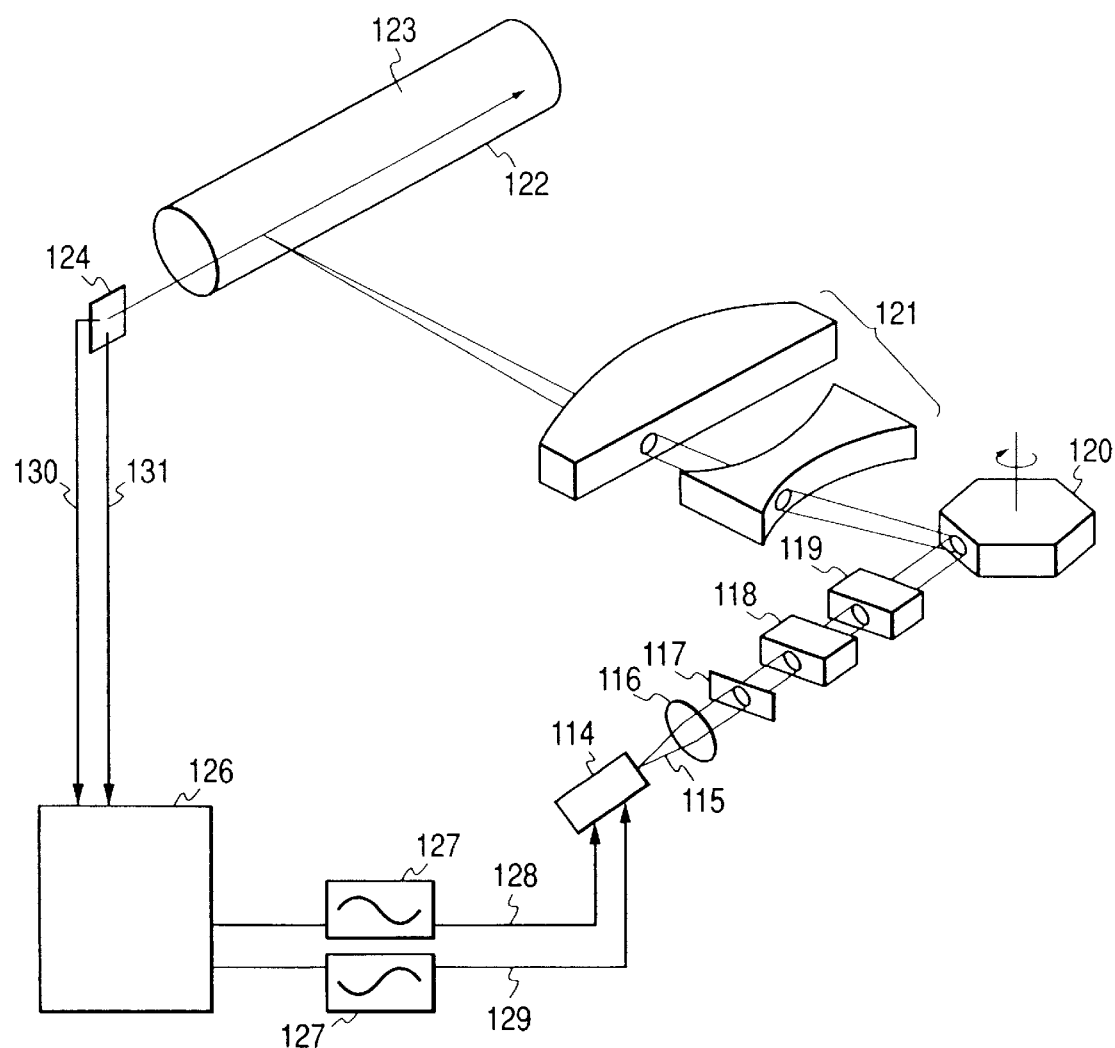
FIG. 2 is a diagram of an exposure unit of a laser printer.

FIG. 2 is a diagram showing an example of an exposure unit in a laser printer. In FIG. 2, a laser beam 115 emitted from a semiconductor laser 114 passes through a collimate lens 116 and the like and is incident on a polygonal mirror 120 of a light deflector and then is reflected and deflected by rotation of the polygonal mirror 120. A cylindrical lens 119 converges the laser beam onto a line orthogonal to the rotational axis on the mirror surface so as to correct the deviation of the scan position due to a parallelism error of the polygonal mirror 120. Further, the laser beam is converged by a scanning lens system 121 onto the surface of the photoconductor covered by a photosensitive material 122, and scans a scan position 123 at an equal speed repeatedly. In addition, the scan surface is moved at an equal speed in the orthogonal direction to the beam scan. A photodetector 124 detects the start position of the scan beam, and the detection signal is sent as a synchronous signal 125 to a control unit 126.

Figure 3:
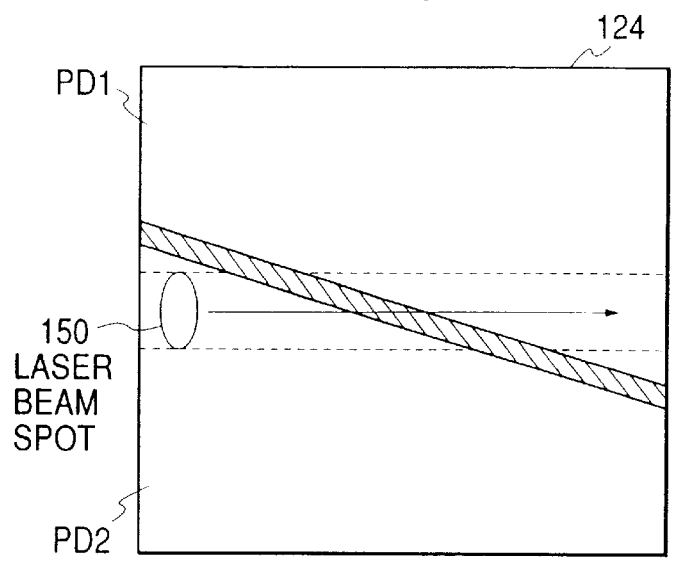
FIG. 3 is a diagram showing a diode of a photodetector.
Figure 5:
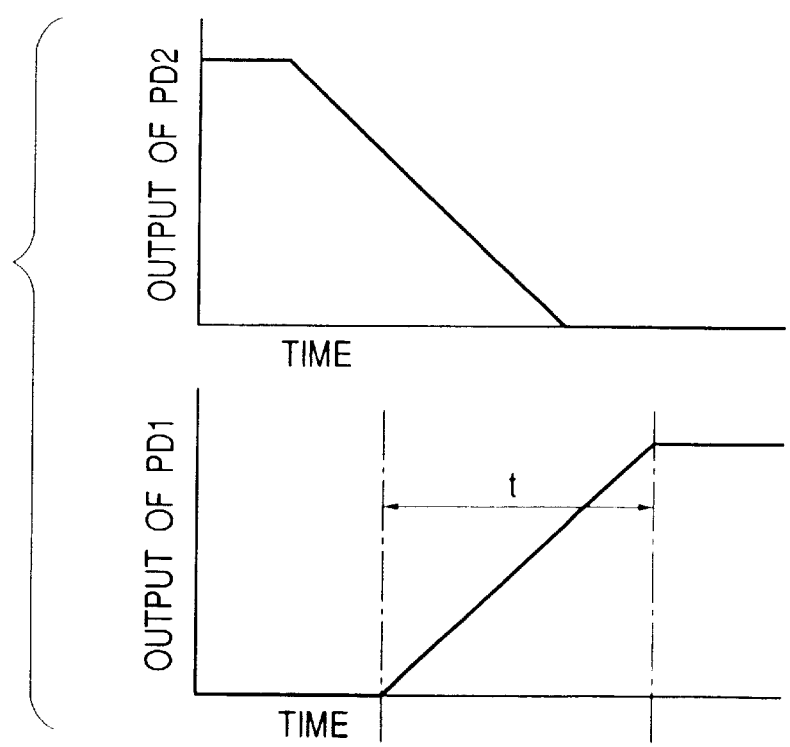
FIG. 5 is a diagram showing the operation current of two diodes of a photodetector.

FIG. 3 is a plan view showing a diode of the photodetector 124 shown in FIG. 2. The photodetector 124 is divided into a scan start signal detecting photodiode PD2 for detecting the beam scan start time and a beam size detecting photodiode PD1 having a side provided at an angle of about two degrees to the scan line for detecting the beam size from the rise time of the detection signal when the scan beam passes through to that side. In FIG. 3, the hatched portion represents a dividing region between the two photodiodes. FIG. 5 is a diagram showing an operation signal of the photodetector. If the scan by the laser light is started, first, the scan start signal detecting photodiode PD2 generates a signal 151. When a laser spot 150 comes close to the beam size detecting photodiode PDT, an output 152 is generated. When the laser spot is completely included in the beam size detecting photodiode, the output becomes constant. The spot of the laser light can be detected by the period t between the time that the output is started and the time that it becomes constant.

Figure 4:
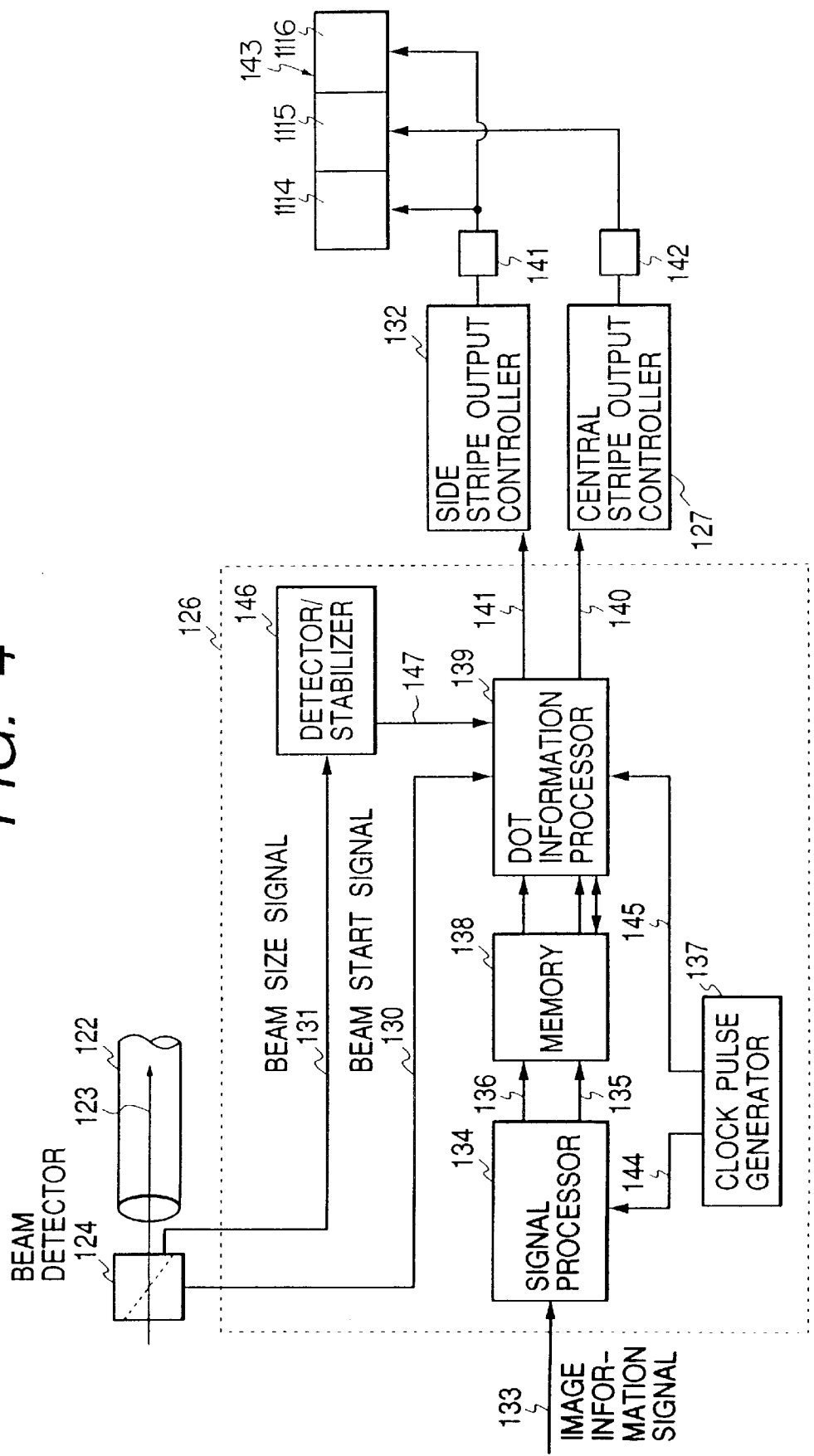
FIG. 4 is a block diagram of a control unit of the exposure unit in the laser printer shown in FIG. 2.

As seen in FIG. 4, a print signal 133 inputted from the outside of the printer is converted by a signal control processor 134 into a dot size signal 136 for determining the dot size and a dot ON/OFF signal 135 for controlling the dot ON/OFF state, and the converted signals are stored in a memory 138. The signal control processor 134 and the memory 138 are operated in synchronization in response to clock signals 144, 145 supplied from a clock signal generator 137. Signals stored in the memory 138 are processed by a dot information processor 139 in response to the beam scan start signal 130, and modulation signals 141, 140 of a side stripe output control circuit 132 and a center stripe output control circuit 127 are generated. The center stripe output control circuit 127 and the side stripe output control circuit 132 supply prescribed currents to control electrodes 1114, 1115, 1116 of a semiconductor laser 143 according to a signal from the dot information processor 139. The electrodes 114 and 116 are side stripe electrodes, and the electrode 115 is a center stripe electrode. Although this embodiment is directed to an example having three stripes, when more stripes are used, the electrodes are set and connected, of course, based on a similar idea. In addition, the dot information processor 139 determines the current value to control the beam size in consideration of a beam size feedback signal 147 generated in a beam size detection/reference value stabilizing circuit 146.

Figure 6A:
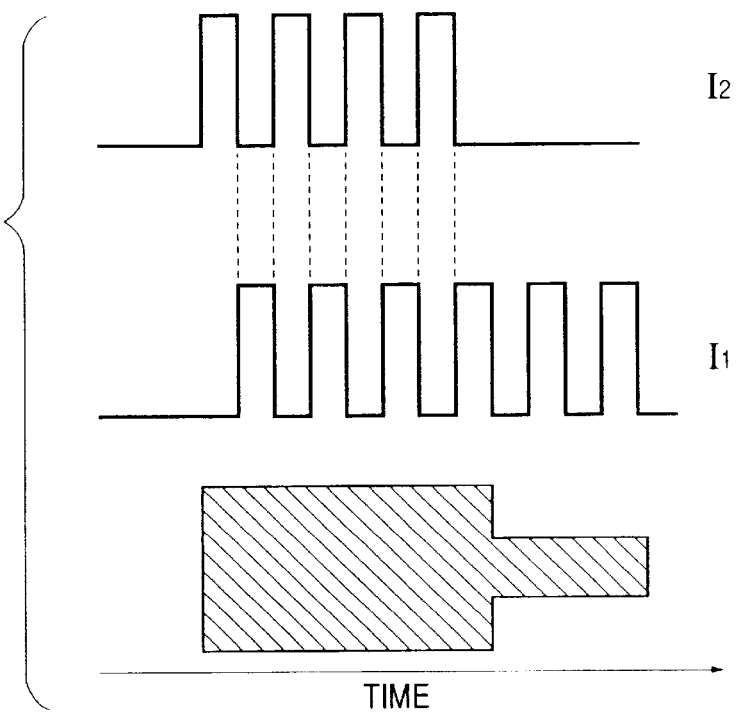
FIG. 6(a) is a diagram showing waveform of a current supplied to each stripe.
Figure 6B:
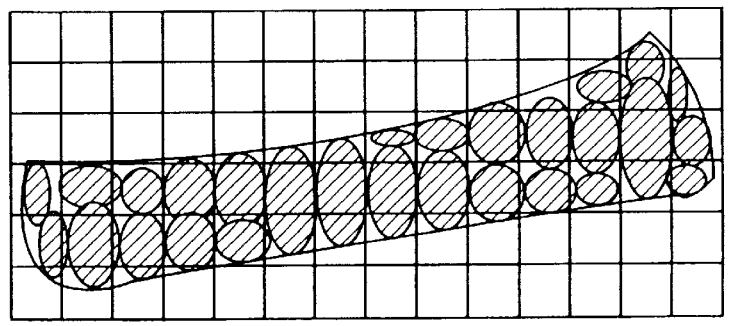
FIG. 6(b) is a diagram of an example of the shape of laser light obtained on a projection surface.

FIG. 6(a) exemplifies the waveform of a high-frequency current injected to each stripe of the semiconductor laser and FIG. 6(b) shows the shape of a beam on a projection surface corresponding to the high-frequency current. This is an example using three stripes. When the beam having an large injection surface shape is used, it is essential that currents supplied to the center stripe are in inverse phases with respect to each other. In FIG. 6(a), I1 designates the waveform of a supply current for the center stripe, and I2 designates the waveform of a supply current for the side stripe (hatched figure in FIG. 6(a)). A part of a beam having large projection surface shape selected in this manner is shown in comparison with the case of light emission in one stripe.

As a light source for an exposure unit as briefly described hitherto, the semiconductor laser according to the present invention is preferable. That is, FIG. 6(b) is a diagram showing an example where a scan is performed using large and small beam spots. Since large beam spots are used, the time required in the scan for high precision printing can be reduced. The present invention can vary the beam spot diameter while the light density is held constant.

Embodiment 1

Figure 7:
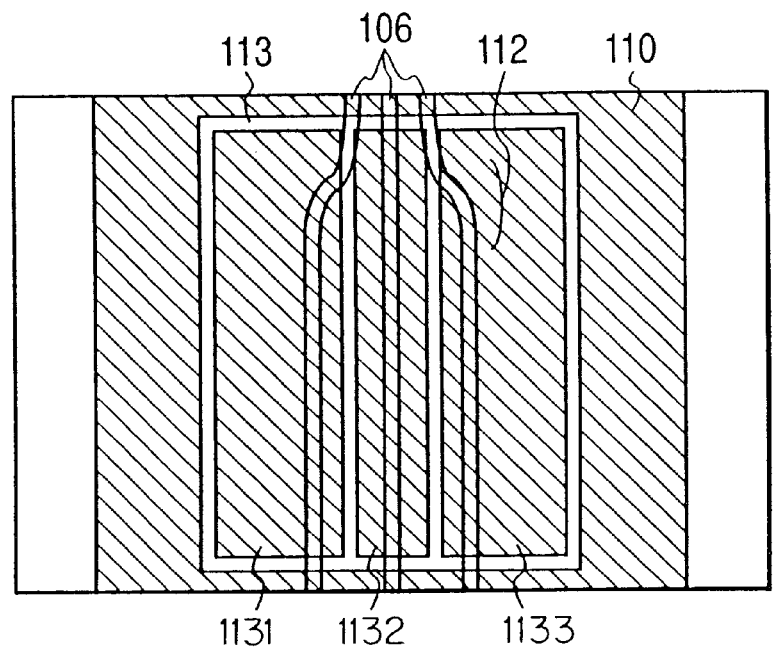
FIG. 7 is a plan view of a semiconductor laser in a first embodiment of the invention.
Figure 8:
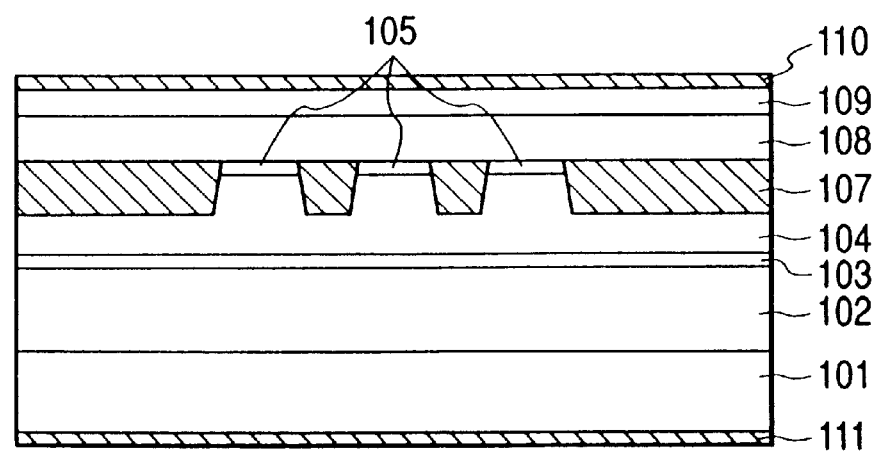
FIG. 8 is a sectional view of a semiconductor laser in the first embodiment of the invention.

A first embodiment of the present invention will be described with reference to the accompanying drawings. FIGS. 7 and 8 are diagrams showing a planar configuration and sectional structure of a semiconductor laser used as a light source.

On a prescribed n-GaAs substrate 101, n-$Al_{0.5}Ga_{0.5}As$ cladding layer 102, multi-quantum-well active layer 103, p-$Al_{0.5}Ga_{0.5}As$ cladding layer 104 and p-GaAs contact layer 105 are subjected to crystal growth in sequence. The multi-quantum-well active layer 103 is formed by alternate stacking of three GaAs well layers (7 nm) and four $Al_{0.3}Ga_{0.7}As$ barrier layers (4 nary). Next, on the semiconductor stacking body prepared in this manner, three $SiO_2$ films in stripe shape are formed using the usual thermal CVD method and photo-lithograph technology. The position of each stripe is formed corresponding to the shape of each stripe 106 for a laser as shown in FIG. 7. Using the $SiO_2$ film as a mask, a part of the p-GaAs contact layer 105 and the p-$Al_{0.5}Ga_{0.5}As$ cladding layer 104 is etched.

Then, an n-GaAs block layer 107 is grown selectively in a region without an $SiO_2$ film by an organic metal vapor phase growth method. In order to reduce the series resistance of the semiconductor laser, after the $SiO_2$ film is removed, a p-$Al_{0.5}Ga_{0.5}As$ buried layer 108 and a p-GaAs buried layer 109 are formed. Next, an electrode conductor 110 (hatched portion in FIG. 7) with Au being the main constituent is formed on a surface of the wafer. In the layer from the electrode conductor 110 to the p-$Al_{0.5}Ga_{0.5}As$ buried layer 108, an isolation groove 113 is provided so that individual stripes can be driven independently. The isolation groove 113 is shown in FIG. 7, but is omitted in FIG. 8. Each of numerals 1131, 1132, 1133 in FIG. 7 designates an electrode for each stripe.

Subsequently, the GaAs substrate is etched to about 100 $\mu$m by mechanical grinding and chemical etching, and an electrode 111 with Au being the main constituent is formed also on the GaAs substrate side. Such a semiconductor wafer is cleaved in bar shape at an interval of about 600 $\mu$m. A conventional method, such as the coating of a protective film on the light emission end surface or the like, may be used. Thus, the semiconductor laser device to be used in this embodiment is completed.

A waveguide in stripe shape forming a laser resonator has width of about 4 $\mu$m. Among the stripes 106, one stripe at the center extends straight through the resonator as a whole, and the two stripes on either side are partially bent. This bent portion is designated as 112. Due to this bending, although the maximum distance of each stripe is about 50 $\mu$m, the distance d of the emission spots may be established in range of 2w>d>w when diameter of the spot is w. In this embodiment, the spot diameter w is about 4 $\mu$m.

Here, in a state wherein the emission of each stripe has a spatial superposition, the beam form is not disturbed by mutual interference, that is, phase synchronization is not performed. The criterion of this state is that the value of the superposition integral ($\int \phi 1 \cdot \phi 2 \, dz$) of each beam ($\phi 1, \phi 2$) is about 1% of self integral ($\int \phi 1 \cdot \phi 1 \, dz$) of the respective beams. In addition, $\phi 1 \cdot \phi 2$ is the optical field. The feature regarding the spatial superposition of the light relates to the present invention and applies also to other embodiments.

Figure 9:
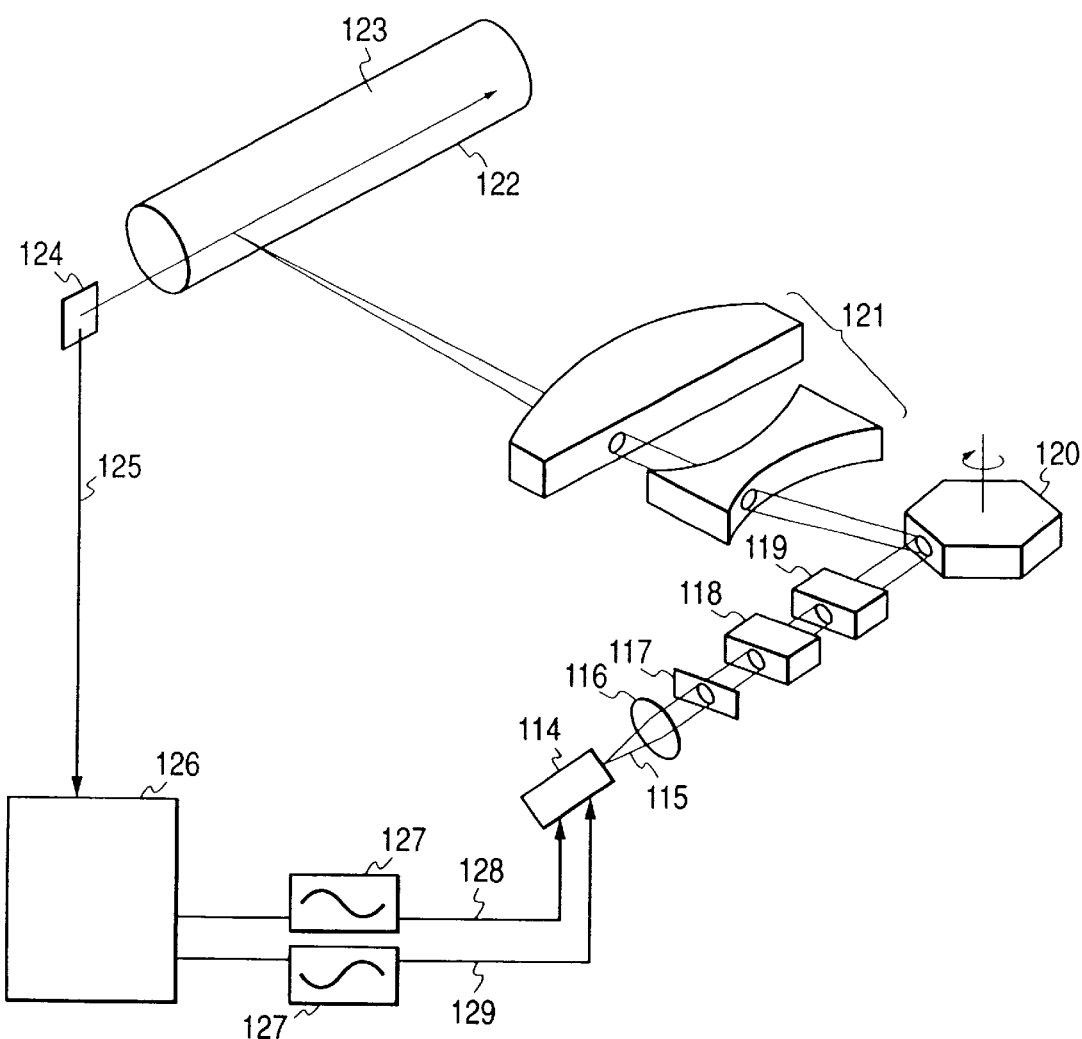
FIG. 9 is a diagram of a laser printer of the invention.

FIG. 9 shows an example of an optical system of a laser printer using the semiconductor laser of the present invention. A laser beam 115 emitted from a semiconductor laser 114 passes through a collimate lens 116 and the like and is incident on a polygonal mirror 120 of a light deflector. Subsequently, the laser beam is reflected and deflected by rotation of the polygonal mirror 120. A cylindrical lens 119 converges the laser beam onto a line orthogonal to the rotational axis on the mirror surface so as to correct the deviation of the scan position due to a parallelism error of the polygonal mirror 120. Further, the laser beam is converged by a scanning lens system 121 onto the scan surface of the photoconductor covered by a photosensitive material 122, and scans a scan position 123 at an equal speed repeatedly. In addition, the scan surface is moved at an equal speed in the orthogonal direction to the beam scan. A photodetector 124 detects the start position of the scan beam, and the detection signal is sent as a synchronous signal 125 to a control unit 126.

Currents driving the semiconductor laser are separated into a current 128 for the center stripe and a current 129 for stripes at both sides and are modulated in intensity by a current from the control unit. Further, a high-frequency pulse of about 100 MHz is superposed by a high-frequency superposition circuit 127. Moreover, the phase of high-frequency pulse is set so that the stripe at the center and the stripes on both sides do not perform light emission simultaneously. In addition, since the printing is modulated at several MHz, a modulation speed of 100 MHz or more is preferable. In this constitution, a flickering of the laser light corresponding to each stripe can not be discerned in the printing pattern.

Figure 10A:
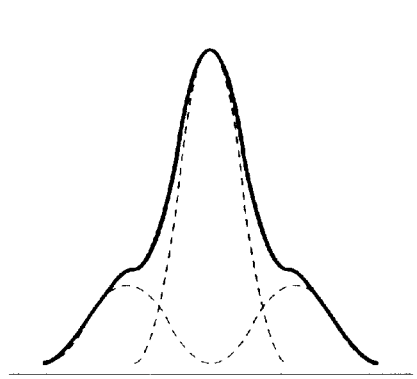
FIGS. 10(a) and 10(b) are diagrams of examples of the distribution of light intensity.
Figure 10B:
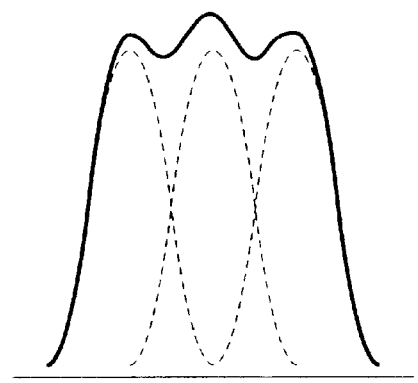

FIG. 10(a) shows the distribution of the light intensity when the center of the semiconductor laser is oscillated strongly and the stripes on both sides are oscillated weakly, and FIG. 10(b) shows the distribution when the three stripes are oscillated in outputs of a comparative degree. In comparison with the case where the center stripe is oscillated strongly and the stripes on both sides are oscillated weakly (FIG. 10(a)), in the case that the three stripes are all oscillated with the same light intensity (FIG. 10(b)), the spot diameter becomes about three times the size. When the three stripes are all oscillated, if the current injection is performed to all stripes simultaneously, the laser rays in respective stripes interfere with each other and a so-called anti-phase-mode oscillation is performed, and a spot of smooth shape can not be obtained. In this embodiment, however, since the stripe at the center and the stripes on both sides are not oscillated simultaneously, mutual interfere does not occur and a smooth light intensity distribution can be obtained. When the conduction amount to the stripes on both sides is controlled, the spot diameter can be varied from a single spot to a spot three times the size thereof continuously, and moreover, if the conduction amount of the stripe at the center is held constant, only the spot diameter will be varied. According to this system, the printing at high speed and at high resolution can be easily realized.

Embodiment 2

A second embodiment of the present invention will be described with reference to the accompanying drawings.

Figure 11:
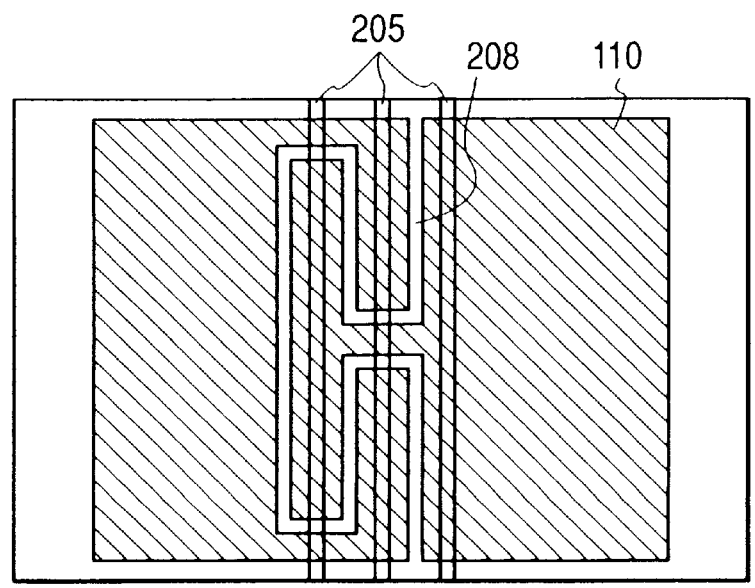
FIG. 11 is a plan view of a semiconductor laser in a second embodiment of the invention.
Figure 12:
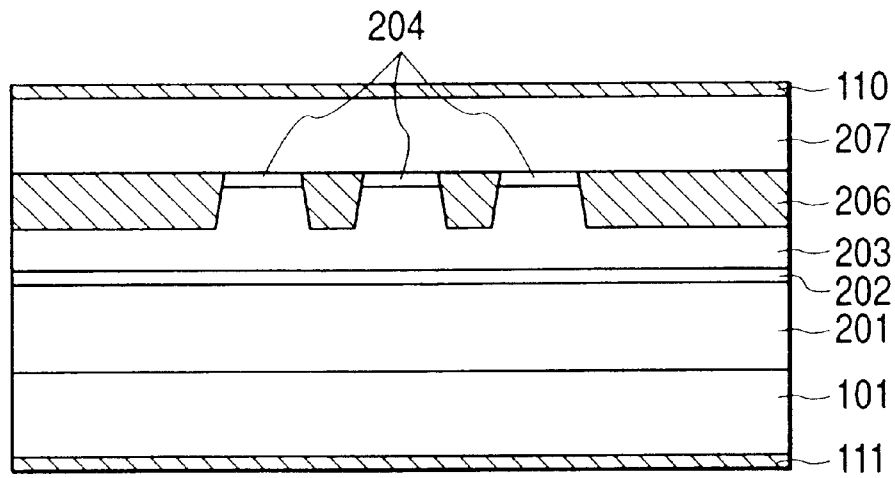
FIG. 12 is a sectional view of the semiconductor laser in a second embodiment of the invention.

FIGS. 11 and 12 are a plan view and a sectional view, respectively, of a semiconductor laser used as a light source.

On a prescribed n-GaAs substrate 101, an n-$(Al_{0.5}Ga_{0.5})_{0.5}In_{0.5}P$ cladding layer 201, a multi-quantum-well active layer 202, a p-$(Al_{0.5}Ga_{0.5})_{0.5}In_{0.5}P$ cladding layer 203 and a p-GaAs contact layer 204 are subjected to crystal growth in sequence. The multi-quantum-well active layer 202 is formed by the alternate stacking of three $Ga_{0.5}In_{0.5}P$ well layers (7 nm) and four $(Al_{0.5}Ga_{0.5})_{0.5}In_{0.5}P$ barrier layers (4 nm).

Next, in this structure, an $SiO_2$ mask is formed in a shape so that three stripes 205 are arranged at ab interval of 5 to 10 µm, as shown in FIG. 11, using the usual thermal CVD method and photo-lithography technology using the $SiO_2$ mask, after a part of the p-GaAs control layer 204 and the p-$(Al_{0.5}Ga_{0.5})_{0.5}In_{0.5}P$ cladding layer 203 is etched, using the $SiO_2$ mask again, an n-GaAs block layer 206 is grown selectively by an organic metal vapor phase growth method. In order to reduce the series resistance of the element, after the $SiO_2$ film is removed, a p-GaAs buried layer 207 is formed.

In order that currents will flow through the stripe at the center and the stripes on both sides independently, an isolation groove 208, as shown in FIG. 11, is formed in the p-GaAs buried layer 207. The isolation groove 208 is not shown in FIG. 12. An electrode conductor 110 (hatched portion in FIG. 11) with Au being a main constituent is formed on a surface of the wafer. The electrode conductor is separated into two parts by the isolation groove 208. Therefore, the stripe at the center and the stripes on either side thereof are different mainly in relationship to an opposite electrode conductor. Thus, the phase relation of the current injection to the stripes at the center and on both sides can be controlled. The basic idea regarding the formation of the divided electrode conductors and the control of the phase of the injection current to each stripe applies also to other embodiments. Of course, the method of cutting the electrode conductor may be different in some embodiments.

Subsequently, the GaAs substrate is etched to about 100 µm by mechanical grinding and chemical etching, and an electrode 111 with Au being a main constituent is formed also in the GaAs substrate side.

Such a semiconductor wafer is cleaved in bar shape at an interval of about 600 µm. The constitution of the optical system in the laser printer of this embodiment is similar to that shown in the first embodiment, and the printing at high speed and at high resolution can be realized using similar method to that of the first embodiment.

Embodiment 3

Figure 13:
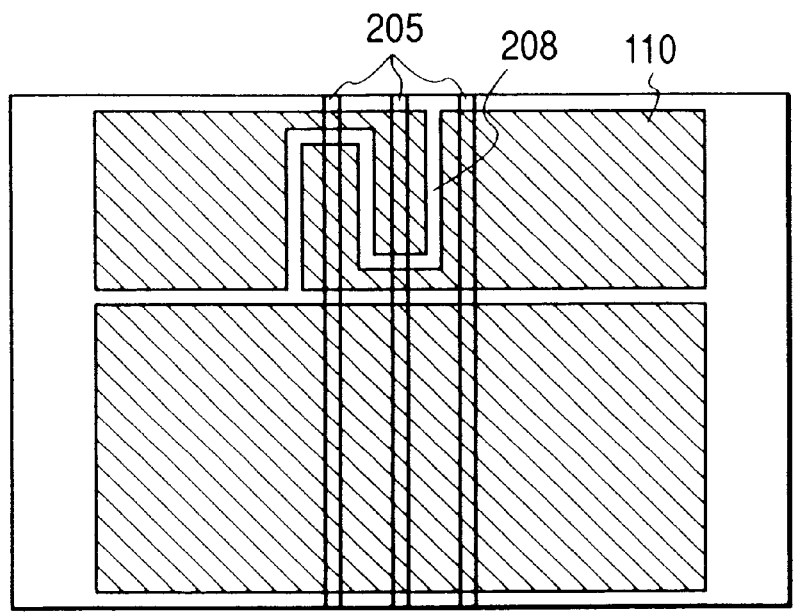
FIG. 13 is a plan view of a semiconductor laser in a third embodiment of the invention.
Figure 14:
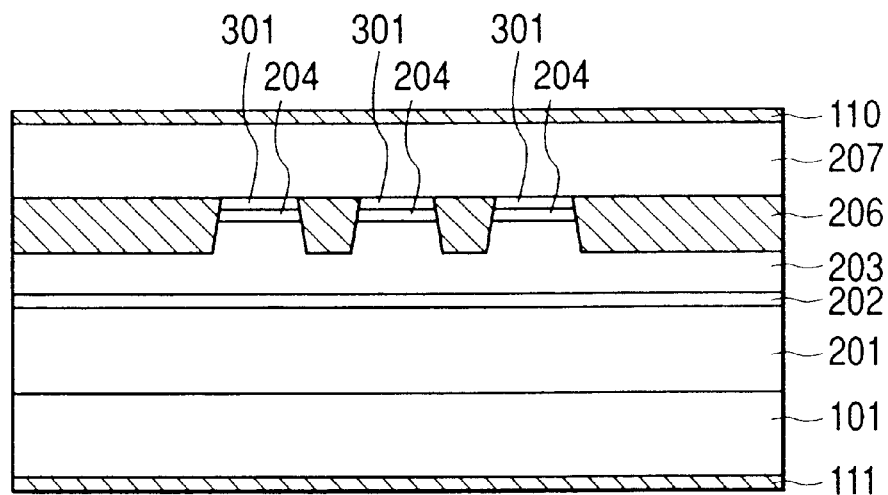
FIG. 14 is a sectional view of the semiconductor laser in the third embodiment of the invention.

A third embodiment of the present invention will be described with reference to the accompanying drawings. FIGS. 13 and 14 are a plan view and a sectional view, respectively, of a semiconductor laser used as a light source.

On a prescribed n-GaAs substrate 101, an n-$(Al_{0.5}Ga_{0.5})_{0.5}In_{0.5}P$ cladding layer 201, a multi-quantum-well active layer 202, a p-$(Al_{0.5}Ga_{0.5})_{0.5}In_{0.5}P$ cladding layer 203, a p-GaAs contact layer 204 and an $In_xGa_{1-x}As$ contact layer 301 are subjected to crystal growth in sequence. The multi-quantum-well active layer 202 is formed by the alternate stacking of three $Ga_{0.5}In_{0.5}P$ well layers (7 nm) and four $(Al_{0.5}Ga_{0.5})_{0.5}In_{0.5}P$ barrier layers (4 nm). In the n-GaAs substrate 101, a window forming groove of 20 µm in a vertical direction to the stripe, 5 µm in parallel direction to the stripe and about 0.5 µm in depth is provided to a region which is to serve as a laser end surface.

Next, in this structure, the $SiO_2$ mask is formed in a shape so that three stripes 205 are arranged at an interval of 5 to 10 µm, as shown in FIG. 13, using a thermal CVD method and photo-lithograph technology. Using an $SiO_2$ mask, after etching is performed from the InGaAs cap layer 301 to a part of the p-$(Al_{0.5}Ga_{0.5})_{0.5}In_{0.5}P$ cladding layer 203, using the $SiO_2$ mask again, an n-GaAs block layer 206 is grown selectively by an organic metal vapor phase growth method. In order to reduce the series resistance of the element, after the $SiO_2$ film is removed, a p-GaAs buried layer 207 is formed.

In this embodiment, the composition of the $In_xGa_{1-x}As$ contact layer 301 (20 nm) is varied in a range of 0 to 0.3, and the result is that the contact resistance of the contact layer with the buried layer is significantly reduced.

In order that currents flow through the stripe at the center and the stripes on both sides independently, an isolation groove 208, as shown in FIG. 13, is formed in the p-GaAs buried layer 207. The reason for dividing the electrode conductor 110 using the isolation groove 208 is similar to that for the embodiments hitherto described. Thus, the electrode 110 (hatched portion in FIG. 13) with Au being a main constituent is formed on a surface of the wafer.

Subsequently, the GaAs substrate is etched to about 100 µm by mechanical grinding and chemical etching, and an electrode 111 with Au being a main constituent is formed also at the GaAs substrate side.

In a part of such semiconductor wafer, a cleavage induction groove about 10 m in depth, about 20 µm in width and 100 µm in length is formed so that one side of the groove is coincident with the center of the window forming groove. The cleavage induction groove is provided at the same interval as that of the resonator length (600 µm) in a direction parallel to the stripe and at an interval of 5 to 10 mm in a direction orthogonal to the stripe. A diamond scriber is moved at a definite angle (not zero) with respect to the cleavage induction groove, so that a flaw is produced on the crystal and the crystal is cleaved in bar shape at an interval of about 600 µm. The error in the cleavage position is about 1 µm. According to this semiconductor laser, in the light emission surface, the active layer which is liable to damage due to light absorption is outside of the light spot and the decrease of the flickering ratio due to the pulse driving can be compensated. Moreover, since a region of the active layer is deviated from the light spot only 2 to 3 µm in a direction parallel to the stripe, the deterioration of the laser characteristics due to the window region is scarcely seen.

The constitution of the optical system in the laser printer of this embodiment is similar to that shown in the first embodiment. In order to improve the high frequency modulation characteristics, the contact resistance is reduced by the InGaAs cap layer 301, and 75% of the length of each stripe-shaped resonator is normally conducted, with only the remaining 25% being subjected to current modulation.

According to this device, in a manner similar to the first embodiment and the second embodiment, there is not only an effect due to variation of the spot shape, but also an effect due to improvement of the modulation speed, and an enhanced high picture quality can be realized.

Embodiment 4

Figure 15:
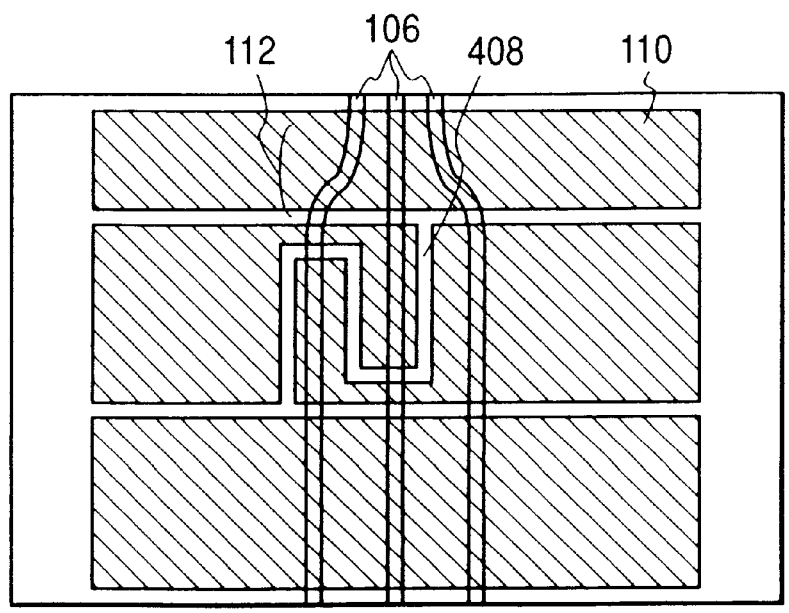
FIG. 15 is a plan view of a semiconductor laser in a fourth embodiment of the invention.
Figure 16:
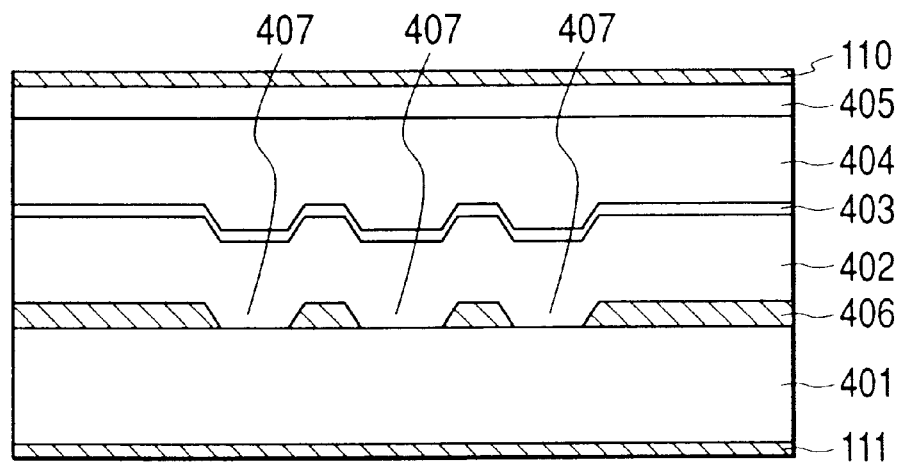
FIG. 16 is a sectional view of the semiconductor laser in the fourth embodiment of the invention.

A fourth embodiment of the present invention will be described with reference to the accompanying drawings. FIGS. 15 and 16 are a plan view and a sectional view, respectively, of a semiconductor laser used as a light source.

On a prescribed n-SiC substrate 401, an n-$Al_{0.5}Ga_{0.8}N$ cladding layer 402, a multi-quantum-well active layer 403, a p-$Al_{0.2}Ga_{0.8}N$ cladding layer 404 and a p-GaN contact layer 405 are subjected to crystal growth in sequence. The multi-quantum-well active layer 403 is formed by the alternate stacking of seven $Al_{0.3}Ga_{0.7}In_{0.2}N$ well layers (2 nm) and eight $Al_{0.3}Ga_{0.7}N$ barrier layers (2 nm). On the surface of the n-SiC substrate, a p-SiC layer 406 of about 0.5 μm in thickness is provided by ion implantation, and a groove of about 3 μm in width and 1 μm in depth is formed only in the stripe-shaped region 106 forming the waveguide of the semiconductor laser shown in FIG. 15. If the crystal growth is performed on a substrate having such a level difference, also in the active layer 403, the level difference as shown in FIG. 16 is formed and becomes the light waveguide structure. Such a waveguide structure utilizing a level difference produces a problem in reliability in other material systems, such as an AlGaAs system or an AlGaInP system, but in the crystal of a GaN system, where sufficient reliability is obtained with a defect density of less than 107 per one $cm^2$, a semiconductor laser of sufficiently high reliability can be obtained with this structure.

The stripe in this embodiment has a structure such that a part of the stripe is bent (bent portion is designated as 112) in a similar manner to the first embodiment. Besides this, on the SiC substrate 401 of the region to be used as the laser end surface, a window forming groove of 20 μm in a transverse direction to the stripe, 5 μm in a parallel direction to the stripe and about 0.5 μm in depth is provided. Also, in the $p-Al_{0.2}Ga_{0.8}N$ cladding layer 404 and the p-GaN contact layer 405, an ion implantation region 408 for electric isolation is provided. The electric isolation region 408 fills the same roll as that of the isolation groove of the electrode conductor as above described. For the electric isolation, of course, other isolation means may be used.

On a surface of the wafer, an electrode conductor 110 (hatched portion in FIG. 15) with Au being a main constituent is formed, and the SiC substrate 401 is etched to about 100 μm by mechanical grinding and chemical etching, and an electrode 111 with Au being a main constituent is formed also at the GaAs substrate side.

On a part of such a semiconductor wafer, a cleavage induction groove of about 10 μm in depth, about 20 μm in width and 100 μm in length is formed so that one side of the groove is coincident with the center of the window forming groove. When a diamond scriber is moved at an angle (not zero) with respect to the cleavage induction groove so as to cross the side coincident with the center of the window forming groove, a flaw is produced on the crystal and the wafer is cleaved in a bar shape at an interval of about 600 μm using the flaw. The error in the cleavage position is about 1 μm.

According to this semiconductor laser, since the active layer which is liable to optical damage due to light absorption is deviated from the light spot in the light emission end surface, the end surface breakdown output is multiplied and a decrease of the average output due to the pulse driving can be compensated. Moreover, since the region of the active layer is deviated from the light spot only 2 to 3 μm in a direction parallel to the stripe, a deterioration of the laser characteristics due to the window region is scarcely seen.

The constitution of the optical system in the laser printer of this embodiment is similar to that shown in the first embodiment, but in order to reduce the current for high frequency modulation, 75% of the length of each stripe-shaped resonator is normally conducted and only the remaining 25% is subjected to current modulation. According to this device, since a similar effect to that of the first embodiment can be obtained and there is an effect due to a short wavelength such as 430 nm, printing with an increased high speed and high picture quality can be realized.

Embodiment 5

Figure 17:
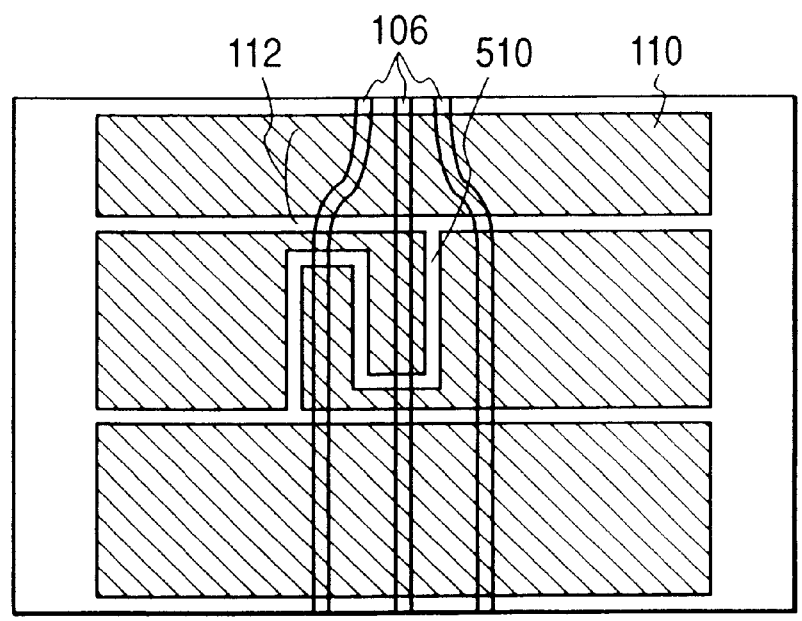
FIG. 17 is a plan view of a semiconductor laser in a fifth embodiment of the invention.
Figure 18:
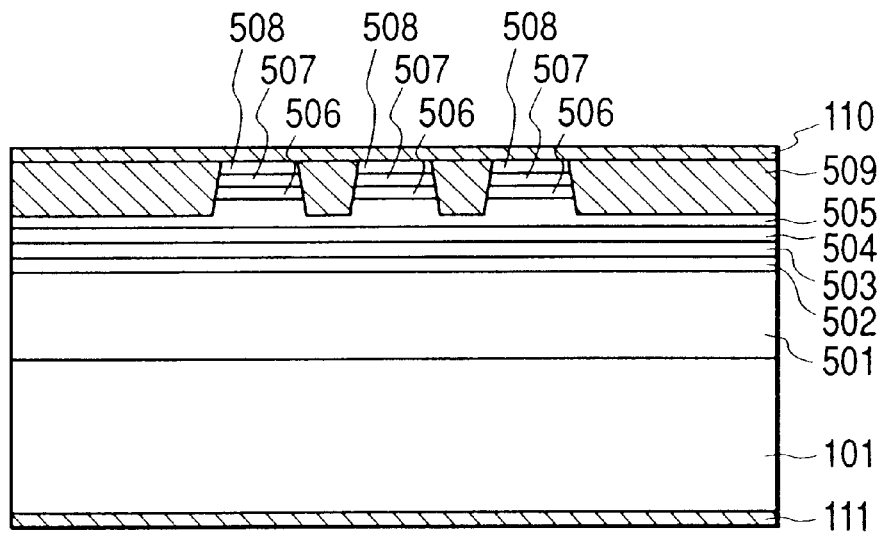
FIG. 18 is a sectional view of the semiconductor laser in the fifth embodiment of the invention.

A fifth embodiment of the present invention will be described with reference to the accompanying drawings. FIGS. 17 and 18 are a plan view and a sectional view of a semiconductor laser used as a light source.

On a prescribed n-GaAs substrate 101, an $n-Zn_{0.86}Mg_{0.14}S_{0.1}Se_{0.9}$ cladding layer 501, a multi-quantum-well active layer 502, a $p-Zn_{0.86}Mg_{0.14}S_{0.1}Se_{0.9}$ cladding layer 503, a $p-Zn_{0.86}Mg_{0.14}Se$ strain absorbing layer 504, a $p-Zn_{0.86}Mg_{0.14}S_{0.1}Se_9$ cladding layer 505, a p-ZnSe contact layer 506, a ZnSe/ZnTe super lattice contact layer 507 and a ZnTe contact layer 508 are subjected to crystal growth in sequence. The multi-quantum-well active layer 502 is formed by the alternate stacking of six $Zn_{0.7}Cd_{0.3}Se$ well layers (5 nm) and seven $ZnS_{0.1}Se_{0.9}$ barrier layers (3 nm).

Next, in this structure, an $SiO_2$ mask in stripe shape is formed in the shape of a stripe 106 which is partially bent (bent portion is designated as 112), as shown in FIG. 17, using the usual thermal CVD method and photo-lithograph technology. Using the $SiO_2$ mask, etching is performed from the ZnTe contact layer 508 to the midway point of the $p-Zn_{0.86}Mg_{0.14}S_{0.1}Se_{0.9}$ cladding layer 505, and a cladding layer of about 0.5 μm remains. Further, the photoresist is removed and using the remaining $SiO_2$ as a mask, etching is further performed on the p-ZnSe cap layer 506. Next, after the $SiO_2$ mask is removed, an SiN film 509 (film thickness 1.2 μm) is stacked by a plasma CVD method. Since the stacked SiN film becomes thin at a shoulder portion of the stripe, the ZnTe layer of the shoulder portion can be exposed by weak etching using an etching liquid of fluoric acid. If the photo resist of about 1 μm is spread and etched back by oxygen plasma, the surface of SiN stacked on the stripe is exposed. Here, if the SiN film is etched by the CF4 plasma, only the top end of the plasma can be exposed. On the surface of the wafer, an electrode conductor 110 (shown as a hatched portion in FIG. 17) with Au being a main constituent is formed.

The GaAs substrate is etched to about 100 μm by mechanical grinding and chemical etching, and an electrode 111 with Au being a main constituent is formed also at the GaAs substrate side. On the surface electrode 110, a gap 510 is provided so that respective stripes can be driven independently.

In a part of such semiconductor wafer, a cleavage induction groove of about 10 μm in depth, about 20 μm in width and 100 μm in length is formed so that one side of the groove is coincident with the center of the window forming groove. When a diamond scriber is moved at an angle (not zero) with respect to the cleavage induction groove so as to cross the side coincident with the center of the window forming groove, a flaw is produced on the crystal and the wafer is cleaved in a bar shape at an interval of about 600 μm using the flaw. The error in the cleavage position is about 1 μm. When the cleavage induction groove is formed in the (110) direction, a so-called reverse mesa direction, the cleavage position can be controlled with higher accuracy.

According to this semiconductor laser, since the active layer which is liable to damage due to light absorption is deviated from the light spot in the light emission surface, a decrease of the flickering ratio due to the pulse driving can be compensated. Moreover, since the region of the active layer is deviated from the light spot by only 2 to 3 μm in a direction parallel to the stripe, a deterioration of the laser characteristics due to the window region is scarcely seen.

The constitution of the optical system in the printer of this embodiment is similar to that shown in the first embodiment, but in order to reduce the current for the high frequency modulation, 75% of the length of each stripe-shaped resonator is normally conducted and only the remaining 25% is subjected to current modulation. According to this device, since a similar effect to that of the third embodiment can be obtained and there is an effect due to a short wavelength such as 510 nm, the printing at a further high speed and with a high picture quality can be realized.

Embodiment 6

Figure 19:
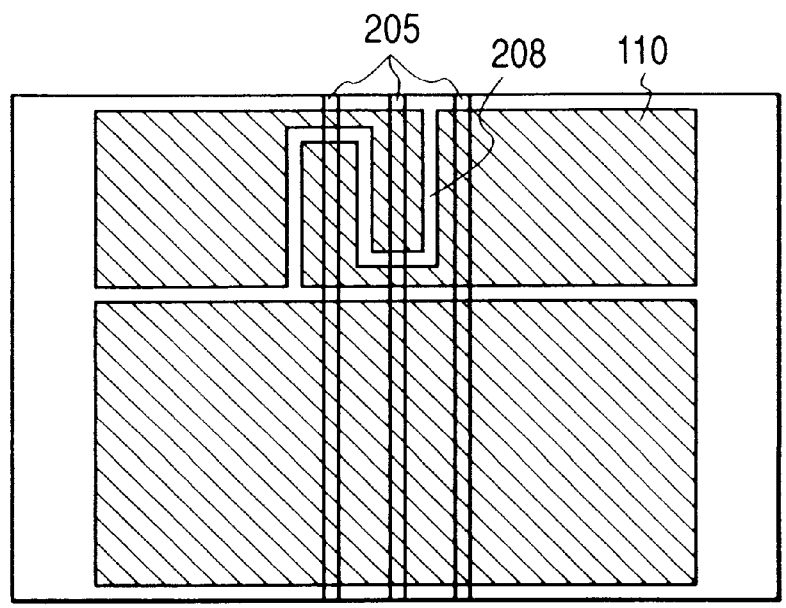
FIG. 19 is a plan view of a semiconductor laser in a sixth embodiment of the invention.
Figure 20:
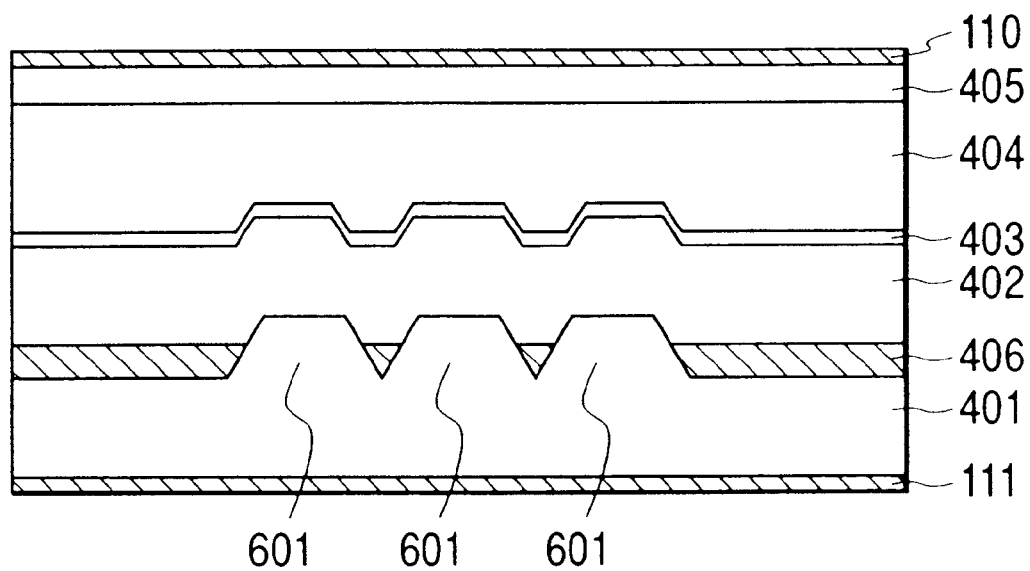
FIG. 20 is a sectional view of the semiconductor laser in the sixth embodiment of the invention.

A sixth embodiment of the present invention will be described with reference to the accompanying drawings. FIGS. 19 and 20 show planar structure and sectional structure, respectively, of a semiconductor laser used as a light source.

On a prescribed n-SiC substrate 401, a n-$Al_{0.2}Ga_{0.8}N$ cladding layer 402, a multi-quantum-well active layer 403, a p-$Al_{0.2}Ga_{0.8}N$ cladding layer 404 and a p-GaN contact layer 405 are subjected to crystal growth in sequence. The multi-quantum-well active layer 403 is formed by the alternate stacking of five $Ga_{0.7}In_{0.3}N$ well layers 405 and six $Al_{0.5}Ga_{0.5}In_{0.5}N$ barrier layers 406. On the surface of the n-SiC substrate 401, a ridge 601 of about 3 $\mu$m in width and 1 $\mu$m in height is formed only in a region in the shape of a stripe 205 provided at an interval of 2 to 3 $\mu$m to constitute a waveguide of the semiconductor laser, as shown in FIG. 20. Such a ridge is not formed in 5 $\mu$m of a region which is to be used as a laser end surface. In a region outside the ridge, a p-SiC layer 406 with a conduction type inverted into the p-type is formed by boron ion implantation. An electrode 110 (hatched portion in FIG. 19) with Au being a main constituent is formed on the surface of the wafer.

Further, the SiC substrate 401 is etched to about 100 $\mu$m by mechanical grinding and chemical etching, and an electrode 111 with Au being a main constituent is formed also at the side of the SiC substrate 401. Such a semiconductor wafer is cleaved at an interval of 600 $\mu$m to form a laser chip.

The constitution of the optical system in the laser printer of this embodiment is similar to that shown in the first embodiment, but in order to reduce the current for the high frequency modulation, 75% of the length of each stripe-shaped resonator is normally conducted and only the remaining 25% is subjected to current modulation. According to this device, since a similar effect to that of the third embodiment can be obtained and there is an effect of a short wavelength such as 430 nm, printing at a further high speed and with high picture quality can be realized.

What is claimed is:

1. A laser printer comprising a semiconductor laser and a photoconductor;

wherein laser rays emitted from said semiconductor laser are irradiated onto said photoconductor to vary its surface potential to produce a charge pattern to which charged particles adhere, and printing is performed by transferring charged particles to a printing object, said semiconductor laser including a plurality of waveguide type resonators for emitting light beams which have a spatial superposition with respect to each other, and means for flickering the light emission so that at least one of the light beams emitted from the resonators having a spatial superposition with respect to another of the light beams is not superimposed on the another of the light beams in time of emission, and a flickering speed is sufficiently high so that flickering is not observed in a printing pattern.

2. A laser printer as set forth in claim 1, wherein the resonators exist as an odd number of stripes, and a group of every other stripe including a center stripe and another group of every other stripes not including the center stripe flicker complementarily.

3. A laser printer as set forth in claim 1 to 2, wherein regions other than the resonators are recovered by an insulator, and a layer with a forbidden band gap shrinking slantwise towards an electrode side is formed between a semiconductor crystal and a metal electrode of the resonator part.

4. A laser printer comprising a semiconductor laser and a photoconductor;

wherein laser rays emitted from said semiconductor laser are irradiated onto said photoconductor to vary its surface potential to produce a charge pattern to which charged particles adhere, and printing is performed by transferring charged particles to a printing object, said semiconductor laser including a plurality of waveguide type resonators for emitting light beams which have a spatial superposition with respect to each other, and means for flickering the light emission so that at least one of the light beams emitted from the resonators having a spatial superposition with respect to another of the light beams is not superimposed on the another of the light beams in time of emission, and a flickering speed is sufficiently high so that flickering is not observed in a printing pattern; and wherein at least a part of the resonators is bent so that the distance between the beam emission positions is smaller than an average distance between the resonators.

5. A laser printer comprising a semiconductor laser and a photoconductor;

wherein laser rays emitted from said semiconductor laser are irradiated onto said photoconductor to vary its surface potential to produce a charge pattern to which predetermined particles adhere, and printing is performed by transferring the predetermined particles to a printing object, said semiconductor laser including a plurality of resonators for emitting a set of emitted beams to produce an emitted optical spot having a predetermined diameter, at least one of the emitted beams being emitted at a time not superimposed with a time of emission of an other of the emitted beams; and means for keeping the optical density of the emitted optical spot while the diameter of the emitted optical spot is varied.

6. A laser printer comprising a semiconductor laser and a photoconductor;

wherein laser rays emitted from said semiconductor laser are irradiated onto said photoconductor, to vary its surface potential to produce a charge pattern to which predetermined particles adhere, and printing is performed by transferring the predetermined particles to a printing object, said semiconductor laser including a plurality of resonators for emitting light beams which have a spatial superposition, a group of said emitted light beams having a spatial superposition so that at least one emitted light beam of said group is not superimposed on another emitted light beam of said group in time of emission.

7. A laser printer according to claim 6, wherein said resonators are waveguide type resonators.

8. A laser printer comprising a semiconductor laser and a photoconductor;

wherein laser rays emitted from the semiconductor laser are irradiated onto the photoconductor to vary its surface potential to produce a charge pattern to which predetermined particles adhere, and printing is performed by transferring the predetermined particles to a printing object, said semiconductor laser including a plurality of resonators, and wherein said laser printer has means for emitting a group of light beams having a spatial superposition so that at least one beam of the group of beams is emitted with a lag of time of emission with respect to others of the group of beams in a maximum region of optical intensity of the group of the emitted beams.

* * * * *